(12) United States Patent
Prechtl et al.

(10) Patent No.: US 10,600,710 B2
(45) Date of Patent: Mar. 24, 2020

(54) SEMICONDUCTOR DEVICE

(71) Applicant: Infineon Technologies Austria AG, Villach (AT)

(72) Inventors: Gerhard Prechtl, Rosegg (AT); Clemens Ostermaier, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/206,372

(22) Filed: Nov. 30, 2018

(65) Prior Publication Data
US 2019/0096779 A1 Mar. 28, 2019

Related U.S. Application Data (63) Continuation of application No. 14/620,317, filed on Feb. 12, 2015, now Pat. No. 10,177,061.

(51) Int. Cl.
*H01L 29/423* (2006.01)
*H01L 23/31* (2006.01)
(Continued)

(52) U.S. Cl.
CPC ...... *H01L 23/3171* (2013.01); *H01L 29/1066* (2013.01); *H01L 29/4236* (2013.01);
(Continued)

(58) Field of Classification Search
CPC .............. H01L 29/7787; H01L 29/205; H01L 23/3171
See application file for complete search history.

(56) References Cited

U.S. PATENT DOCUMENTS 8,044,433 B2 10/2011 Kawasaki et al.
8,159,027 B2 4/2012 Kawasaki
(Continued)

FOREIGN PATENT DOCUMENTS

CN 103918069 A 7/2014

OTHER PUBLICATIONS

Chen, et al., "Physics of Fluorine Plasma Ion Implantation for GaN Normally-off HEMT Technology", IEDM 2011-468, 19.4 (2011), Abstract Submitted Herewith.
(Continued)

*Primary Examiner* — Tucker J Wright
*Assistant Examiner* — Wilner Jean Baptiste
(74) *Attorney, Agent, or Firm* — Murphy, Bilak & Homiller, PLLC (57) ABSTRACT

A semiconductor device includes a group III-semiconductor-nitride-based channel layer, a group III-semiconductor-nitride-based barrier layer formed on the channel layer, a two-dimensional electron gas channel formed in the channel layer, a first current electrode and a second current electrode formed on the barrier layer and laterally spaced from each other, and a gate structure formed on the barrier layer between the first and second current electrodes. The barrier layer has a symmetrically shaped recess between the first and second current electrodes, the symmetrically shaped recess including a first recess portion formed in a part of an upper surface of the barrier layer and a second recess portion formed within the first recess portion. The gate structure includes a group III-semiconductor-nitride-based doped layer that fills the symmetrically shaped recess and an electrically conductive gate electrode formed on an upper side of the doped layer that is opposite from the barrier layer.

10 Claims, 6 Drawing Sheets

(51) Int. Cl.
  *H01L 29/778* (2006.01)
  *H01L 29/51* (2006.01)
  *H01L 29/10* (2006.01)
  H01L 29/20 (2006.01)
  H01L 29/207 (2006.01)
(52) U.S. Cl.
  CPC .. *H01L 29/42316* (2013.01); *H01L 29/42376* (2013.01); *H01L 29/512* (2013.01); *H01L 29/7786* (2013.01); H01L 29/2003 (2013.01); H01L 29/207 (2013.01)

(56) References Cited

U.S. PATENT DOCUMENTS

| | | |
|---|---|---|
| 8,207,574 B2 | 6/2012 | Kaneko |
| 2007/0131968 A1 | 6/2007 | Morita et al. |
| 2007/0164314 A1* | 7/2007 | Beach ............... H01L 29/66462 257/194 |
| 2007/0194354 A1* | 8/2007 | Wu ....................... H01L 29/402 257/288 |
| 2009/0057720 A1* | 3/2009 | Kaneko ............. H01L 29/42316 257/194 |
| 2009/0206371 A1 | 8/2009 | Oka |
| 2010/0244018 A1 | 9/2010 | Kaneko |
| 2011/0057257 A1 | 3/2011 | Park et al. |
| 2013/0088280 A1 | 4/2013 | Lal et al. |
| 2014/0159116 A1 | 6/2014 | Briere et al. |
| 2014/0231823 A1 | 8/2014 | Chowdhury et al. |
| 2014/0264431 A1 | 9/2014 | Lal |
| 2016/0043209 A1 | 2/2016 | Oyama |
| 2016/0181364 A1 | 6/2016 | Stewart et al. |

OTHER PUBLICATIONS

Karmalkar, Shreepad, "Publications", http://www.ee.iitm.ac.in/~karmal/publications.html, Accessed Sep. 22, 2014, Jun. 23, 2014, 1-5.

Kuraguchi, et al., "Normally-off GaN-MISFET with well-controlled threshold voltage", PSSa vol. 204, No. 6, 2010-2013 (2007), Abstract Submitted Herewith.

Uemoto, et al., "Gate Injection Transistor (GIT)—A normally-off AlGaN/GaN Power Transistor Using Conductivity Modulation", TED, vol. 54, No. 12. 3393 (2007), Abstract Submitted Herewith.

* cited by examiner

FIG 11

SEMICONDUCTOR DEVICE

PRIORITY CLAIM

This application is a continuation of and claims priority to U.S. patent application Ser. No. 14/620,317 which was filed on Feb. 12, 2015. The entire contents of the above identified prior applications is hereby entirely incorporated herein by reference.

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

In an embodiment, a semiconductor device includes a group III-semiconductor-nitride-based channel layer, a group III-semiconductor-nitride-based barrier layer formed on the channel layer, a two-dimensional electron gas channel formed in the channel layer near an interface between the channel layer and the barrier layer, a first current electrode and a second current electrode formed on the barrier layer and laterally spaced from each other, and a gate structure formed on the barrier layer between the first current electrode and the second current electrode. The gate structure is configured to control a conduction state of the two-dimensional electron gas channel. The barrier layer has a symmetrically shaped recess between the first and second current electrodes, the symmetrically shaped recess including a first recess portion formed in a part of an upper surface of the barrier layer and a second recess portion formed within the first recess portion. The gate structure includes a group III-semiconductor-nitride-based doped layer that fills the symmetrically shaped recess and an electrically conductive gate electrode formed on an upper side of the doped layer that is opposite from the barrier layer.

In an embodiment, a semiconductor device includes a substrate, a Group III nitride-based semiconductor layer formed on the substrate, a first current electrode and a second current electrode formed on the Group III nitride-based semiconductor layer and spaced from each other, and a control electrode formed on the Group III nitride-based semiconductor layer between the first current electrode and the second current electrode. The control electrode includes at least a middle portion, configured to switch off a channel below the middle portion when a first voltage is applied to the control electrode, and second portions adjoining the middle portion. The second portions are configured to switch off a channel below the second portions when a second voltage is applied to the control electrode, the second voltage being less than the first voltage and the second voltage being less than a threshold voltage of the second portions.

In an embodiment, a semiconductor device includes a control electrode including a first portion configured to switch off a channel below the first portion when a first voltage is applied to the control electrode, and second portions arranged adjacent opposing sides of the first portion. The second portions are configured to switch off a channel below the second portions when a second voltage is applied to the control electrode. The second voltage is less than the first voltage and the second voltage is less than a threshold voltage of the second portions.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides.

In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where x<1.

Figure 1:
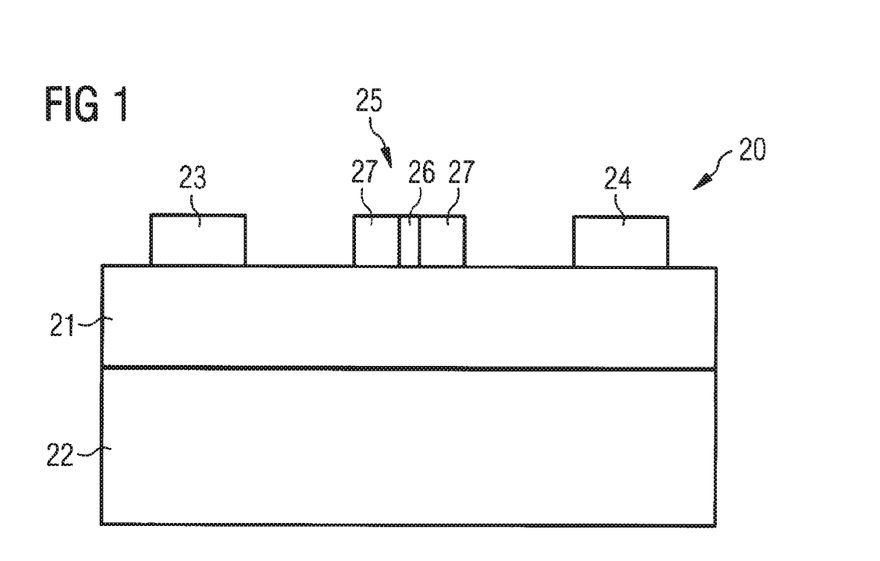
FIG. 1 illustrates a semiconductor device according to a first embodiment.

FIG. 1 illustrates a semiconductor device 20 according to a first embodiment.

The semiconductor device 20 includes a Group III nitride-based semiconductor layer, such as a GaN-based semiconductor layer 21 epitaxially grown on a substrate 22, such as a sapphire substrate.

The semiconductor device 20 further includes a source electrode 23 and a drain electrode 24, formed on the GaN-based semiconductor layer 21 so as to be spaced from each other, as well as a gate electrode 25 formed on the GaN-based semiconductor layer 21 between the source electrode 23 and the drain electrode 24. The gate electrode is divided in a middle portion 26, configured to switch off a channel below the middle portion when a first voltage is applied to the gate electrode 25, and second portions 27 adjoining the middle portion 26 and facing the source electrode 23 respectively the drain electrode 25. The second portions 27 of the gate electrode 25 are configured to switch off a channel below the second portions 27, when a second voltage is applied to the gate electrode 25, which is less than the first voltage and which is less than a threshold voltage of the second portions 27.

Group III-Nitride transistors, such as GaN-based HEMTs, are considered to be promising devices for power applications due to its wide bandgap structure. Such group III-Nitride transistors can for example be used as switching elements of a power conversion device. A power conversion device is a device which converts input power to a desired output power by controlling ON/OFF of an element called a switching element, and may be utilized in various purposes such as power sources of various electronic devices and driving power supply for a motor or the like.

Figure 8:
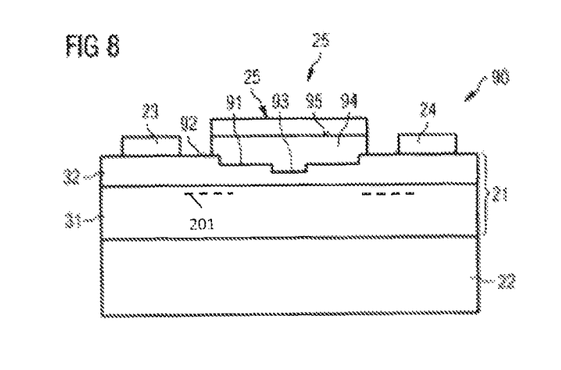
FIG. 8 illustrates a semiconductor device according to an eighth embodiment.

GaN power HEMTs are typically formed as lateral type semiconductor devices, utilizing a two-dimensional electron gas (2DEG), the channel, below an AlGaN barrier. For example, FIG. 8 depicts an example of a 2DEG channel 201 that is formed below a barrier layer 32 of the device.

However, in this design a peak in the electric field at a drain side of a gate edge may occur.

The 2DEG density may be increased or decreased by a difference in polarization between a channel layer and a barrier layer. Polarization is classified into self-polarization and piezoelectric polarization. The self-polarization may be caused by a difference in electronegativity between atoms that compose the GaN-based semiconductor. The piezoelectric polarization may be caused by stress in the semiconductor film due to the difference in lattice constant.

One way to smoothen out the electric field is the integration of field plates connected to the source or the gate electrode, for example a T-shaped gate electrode structure. A lateral extended conductive sheet is described by a low-ohmic connection to a fixed potential and thus causes a reduction of the field the area below it. However, a field plate configuration may include an additional metal area that enlarges towards the drain and may increase the device capacitance, for example the gate-drain capacitance. This may affect the output capacitance of the device and switching loss of the semiconductor device. There may be a peak in the electrical field due to the bundling of field lines at an end of a field plate facing the electrode. An additional field plate above the field plate may be used, which is positioned further away from the channel.

In a T-shaped gate electrode structure, a field plate effect may be achieved by use of a lateral metal extension, facing the source and the drain electrode, and a slanted side wall. Both parts of the gate electrode may contribute to a reduction of the electrical field at a gate edge. The gate-source and the gate-drain capacitance may be increased by these parts.

If a voltage equal to the threshold voltage is applied to a T-shaped gate structure, the channel below the gate can be depleted. However, if a voltage even lower than the threshold voltage is applied to the gate electrode, not only the channel below the gate electrode is depleted but also a small region in the slanted region of the T-shaped gate structure is depleted. In this situation, a maximum peak in the electrical field would be slightly outside a technological gate edge. This point of maximum electrical field however may cause drift of the device and a charge being trapped near to it may influence the threshold voltage. Such threshold voltage shifts may reach several volts for a GaN power HEMT, depending on an epitaxial quality.

A solution to bypass this effect is to reduce an angle of the slanted field plate in a T-shaped gate structure, for example to less than 45°. However, besides its technological challenges, especially in terms of controllability, the gate capacitance of the device may also be increased and, thus, the overall performance of the device may be reduced.

A potential of the gate electrode 25 is separated into two regions, an actual gate region provided by the middle portion 26, that is able to switch off the channel below its area at a first voltage and an adjoining region, and second portions 27, each of which is able to switch off the channel below its area at a second voltage less than the first voltage and less than a threshold voltage of the second portions 27. A stable operation of the semiconductor device 20 shown in FIG. 1 is provided, even if a voltage even lower than the threshold voltage is applied to the gate electrode 25, and influences on the gate capacitance and the electrical field can be avoided.

The semiconductor device may be a normally on semiconductor component such as a depletion mode transistor device, or a normally off semiconductor component such as an enhancement mode transistor device.

The Group III nitride-based semiconductor layer can include a GaN sublayer and an AlGaN sublayer. The AlGaN sublayer may be arranged on the GaN sublayer.

The semiconductor device may further include a passivation layer disposed on an upper surface of the GaN-based semiconductor layer. In some embodiments, the passivation layer is arranged between the upper surface of the GaN-based semiconductor layer and the first current electrode, the second current electrode and the control electrode.

The passivation layer may have a concave portion formed in a part of an upper surface of the passivation layer, a side surface of the concave portion being slanted, and a recess portion formed within the concave portion. The middle portion of the control electrode may be provided in the recess portion and the second portions of the control electrode may be provided in the concave portion outside of the recess portion.

The passivation layer may have a concave portion formed in a part of an upper surface of the passivation layer, a side surface of the concave portion being slanted, and a rising or raised portion formed within the concave portion. The middle portion of the control electrode may be provided on the raised portion and the second portions of the control electrode may be provided in the concave portion outside of the raised portion.

A GaN cap layer can be formed on an upper surface of the AlGaN sublayer. In an embodiment, the GaN cap layer is arranged below the raised portion of the passivation layer only.

The passivation layer may have a concave portion formed in a part of an upper surface of the passivation layer, a side surface of the concave portion being slanted. A portion of the passivation layer below a middle portion of the concave portion may include a first dielectric material and other portions of the passivation layer may include a second dielectric material, the first dielectric material having a first dielectric constant, the second dielectric material having a second dielectric constant being unequal to the first dielectric constant. The middle portion of the control electrode may be provided in the middle portion of the concave portion and the second portions of the control electrode may be provided in the concave portion outside of the middle portion. The first dielectric constant may be greater than or less than the second dielectric constant.

In some embodiments, the AlGaN sublayer has a first recess portion formed in a part of an upper surface of the AlGaN sublayer and a second recess portion formed within the first recess portion. The middle portion of the control electrode may be provided in the second recess portion and the second portions of the control electrode may be provided in the first recess portion outside of the second recess portion.

The control electrode may be a Schottky electrode.

The AlGaN sublayer may have a first recess portion formed in a part of an upper surface of the AlGaN sublayer and a second recess portion formed within the first recess portion. The semiconductor device can further include a p-type doped GaN layer formed on the first recess portion and the second recess portion. The middle portion of the control electrode may be arranged on an upper surface of the p-type doped GaN layer above the second recess portion and the second portions of the control electrode may be arranged on the upper surface of the p-type doped GaN layer above portions of the first recess portion which are arranged outside of the second recess portion.

The AlGaN sublayer may include a first portion and second portions adjacent the first portion Negative charges are incorporated into the first portion and positive charges are incorporated into the second portions. The middle portion of the control electrode may be arranged on the first portion of the AlGaN sublayer and the second portions of the control electrode may be arranged on the second portions of the AlGaN sublayer.

The AlGaN sublayer may include a first portion and second portions adjacent to the first portion. A first number of positive charges are incorporated into the first portion, and a second number of positive charges are incorporated into the second portions, the second number of positive fixed charges exceeding the first number of positive fixed charges. The middle portion of the control electrode may be arranged on the first portion of the AlGaN sublayer and the second portions of the control electrode may be arranged on the second portions of the AlGaN sublayer.

The AlGaN sublayer may include a first portion in which no charges are incorporated and second portions adjacent to the first portion, in which positive charges are incorporated. The middle part of the control electrode may be arranged on the first portion of the AlGaN sublayer and the second portions of the control electrode may be arranged on the second portions of the AlGaN sublayer.

The middle portion of the control electrode and the second portions of the control electrode may be electrically connected. The middle portion and second portions of the control electrode may be integral and form a common component.

In an embodiment, the semiconductor device includes a High Electron Mobility Transistor (HEMT).

Figure 2:
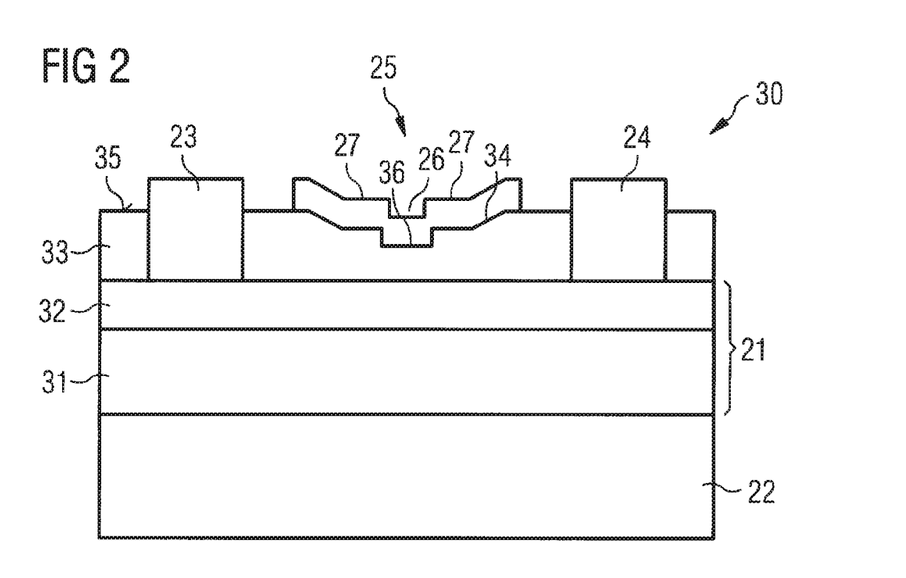
FIG. 2 illustrates a semiconductor device according to a second embodiment.

FIG. 2 illustrates a semiconductor device 30 according to a second embodiment.

The GaN-based semiconductor layer 21 may include a GaN channel layer 31 and an AlGaN barrier layer 32, thereby forming a Group III nitride based HEMT. A robust gate design with a stepped potential for lateral type GaN HEMTs may be provided.

The semiconductor device 30 may further include a passivation layer 33 arranged on the AlGaN barrier layer 32. The passivation layer 33 may be disposed between the GaN-based semiconductor layer 21 and the electrodes, in particular between the AlGaN barrier layer 32 and the source electrode 23, the drain electrode 24 and the gate electrode 25, in order to isolate exposed surfaces of the GaN-based semiconductor layer 2. In some embodiments, the passivation layer 33 may extend between the electrodes such that the source electrode 23 and drain electrode 24 are in direct contact with the AlGaN barrier layer 32. The gate electrode 25 may be arranged on the passivation layer 33 or be in contact with the underlying semiconductor material such as the AlGaN barrier layer 32.

The passivation layer 33 may have a concave portion 34 formed in a part of an upper surface 35 of the passivation layer 33. A side surface of the concave portion 34 is slanted. Further, a recess portion 36 may be formed within the concave portion 34. The middle portion 26 of the gate electrode 25 may be provided in the recess portion 36 and the second portions 27 may be provided in the concave portion 34 outside of the recess portion 36. The potential distribution at the gate electrode 25 may be achieved through a reduction of the thickness of the GaN-based semiconductor layer 21 below the second portions 27 of the gate electrode 25 and a further reduction of the thickness of the GaN-based semiconductor layer 21 below the middle portion 26 of the gate electrode 25.

The semiconductor device 30 may be a depletion mode transistor device which is normally on.

The middle portion 26 of the gate electrode 25 and the second portions 27 of the gate electrode may be electrically connected. In some embodiments, the second portions 27 are integral with the middle portion 26. That the middle portion 26 of the gate electrode 25 and the second portions 27 of the gate electrode 25 are electrically connected should merely be understood as an example, however. For example, the middle portion of the gate electrode and the second portions can be realized by independent electrodes, for example by a split metal gate.

The gate electrode 25 is arranged between the source electrode 23 and the drain electrode 24. In the embodiment illustrated in FIG. 2, the gate electrode 25 includes a first central portion 26 which extends into the second portions 27 on two opposing side faces. The source electrode 23, the drain electrode 24 and the gate electrode 25 may have an elongated strip-like form. One of the second portions 26 extends on each of opposing long sides of the middle portion 26 of the gate electrode 25. One second portion extends in a direction wards the source electrode 23 and a further second portion extends in a direction towards the drain electrode 24.

At least the lower surface of the gate electrode 25 has a form in which the lower surface of the middle portion 26 is positioned in a lower plane than the second portions. For example, the lower surface of the middle portion 26 protrudes further into the passivation layer 33 than the second portions 27. The lower surface of each of the second portions 27 has a first region which extends substantially coplanar with the middle portion and horizontally from the middle portion 26 such that a stepped region is formed adjacent the two opposing sides of the middle portion 26. The lower surface of the second portions has a second region which extends at an inclined angle from the first region outwardly. The upper surface of the gate electrode 25 may have a contour which substantially corresponds to the contour or form of the lower surface or may have a different contour, for example the upper surface of the gate electrode may be substantially planar in both the middle portion 26 and second portions 27.

Whilst the passivation layer 33 is illustrated as a single layer, the passivation layer may include sublayers, for example, a first sublayer which is arranged under the middle portion 26, a second sublayer which is arranged under the second portions 27. A second sublayer may be arranged under the first regions of the second portions and a third sublayer may be provided under the including second regions of the second portions.

The second portion 27 on the drain side of the gate electrode 25 may have a lateral extent which is greater than the lateral extent of the second portion 27 on the source side of gate electrode 25. However, the lateral extent of the second portions 27 may be the same.

Figure 3:
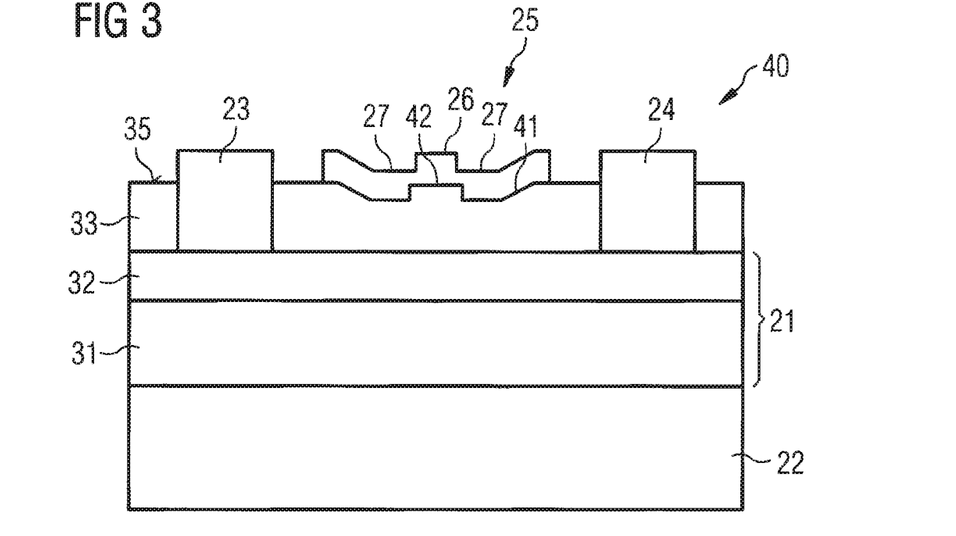
FIG. 3 illustrates a semiconductor device according to a third embodiment.

FIG. 3 illustrates a semiconductor device 40 according to a third embodiment. In the embodiment illustrated in FIG. 3, the semiconductor device 20 includes a substrate 22 and a GaN-based semiconductor layer 21 formed on the substrate. The GaN-based semiconductor layer 21 may include a GaN channel layer 31 and an AlGaN barrier layer 32, thereby forming a GaN-based HEMT.

The semiconductor device 30 may further include a passivation layer 33 arranged on the GaN-based semiconductor layer 21 and may be disposed between the GaN-based semiconductor layer 21 and the electrodes of the semiconductor device 40.

The semiconductor device 40 may be an enhancement mode GaN based HEMT which is normally off and has a positive threshold voltage and cannot conduct current at zero gate voltage.

The passivation layer 33 may have a concave portion 41 formed in a part of an upper surface 35 of the passivation layer 33, a side surface of the concave portion 41 being slanted. A rising or raised portion 42 may be formed within the concave portion 41. The middle portion 26 of the gate electrode 25 may be provided on the rising portion 42 and the second portions 27 may be provided in the concave portion 41 outside of the rising portion 42.

Figure 4:
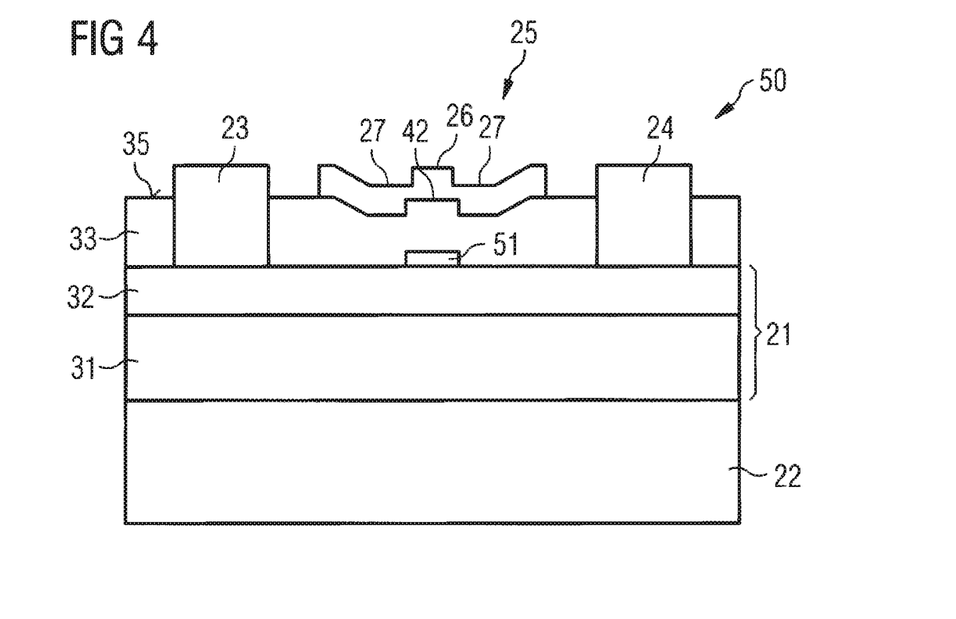
FIG. 4 illustrates a semiconductor device according to a fourth embodiment.

FIG. 4 illustrates a semiconductor device 50 according to a fourth embodiment.

In the embodiment illustrated in FIG. 4, the semiconductor device 50 includes a substrate 22, a GaN channel layer 31 arranged on the substrate and an AlGaN barrier layer 32, arranged on the GaN channel layer 31 to form a GaN-based HEMT. A GaN cap layer 51 may be formed between the AlGaN barrier layer 32 and the passivation layer 33, in particular on an upper surface of the AlGaN barrier layer 32 below the raised portion 42 of the passivation layer 33. The GaN cap layer 51 may assist in reducing the device resistance within the area of the GaN cap layer 51 and the required cut-off voltages can be shifted so that that the second voltage, required for switching off a channel below the second portions 27 of the gate electrode 25 is less than the first voltage, required for switching off a channel below the middle portion 26.

Figure 5:
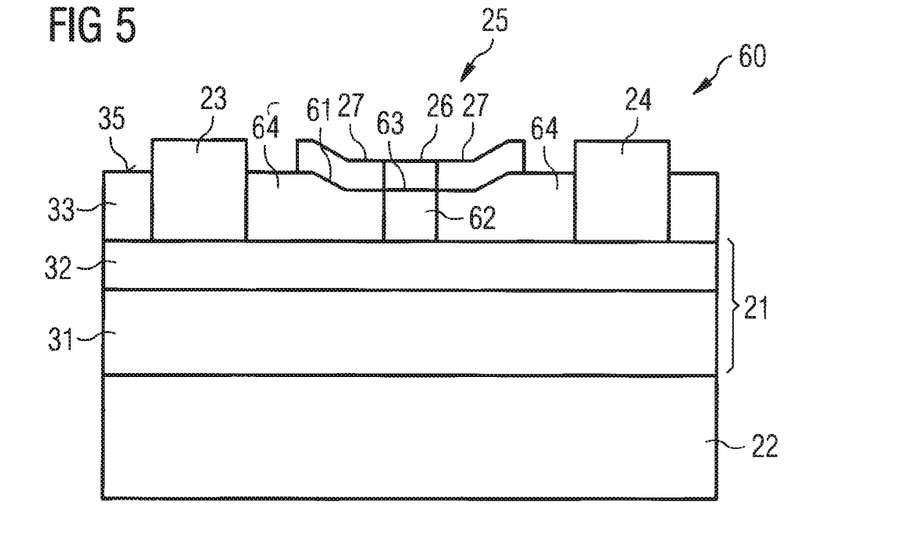
FIG. 5 illustrates a semiconductor device according to a fifth embodiment.

FIG. 5 illustrates a semiconductor device 60 according to a fourth embodiment.

According to the fourth embodiment, the passivation layer 33 may have a concave portion 61 formed in the exposed surface 35 of the passivation layer 33, and a side surface of the concave portion 61 which is slanted. A portion 62 of the passivation layer 33 below a middle portion 63 of the concave portion 61 may include a first dielectric material whereas the other portions 64 of the passivation layer 33 may include a second dielectric material, with the first dielectric material having a first dielectric constant and the second dielectric material having a second dielectric constant which is unequal to the first dielectric constant. The middle portion 26 of the gate electrode 25 may be arranged on the middle portion 63 of the concave portion 61 and the second portions 27 of the gate electrode 25 may be arranged in the concave portion 61, adjoining the middle portion 26 of the gate electrode 25 and outside of the middle portion 63 of the concave portion 61.

A dielectric material is an electrical insulator that can be polarized by an applied electric field. When a dielectric is placed in an electric field, electric charges do not flow through the material as they do in a conductor, but only slightly shift from their average equilibrium positions causing dielectric polarization. Because of dielectric polarization, positive charges may be displaced toward the field and negative charges may shift in the opposite direction. This may create an internal electric field that may reduce the overall field within the dielectric itself. The dielectric constant of a material is the ratio of the permittivity of the material compared to the permittivity of free space.

If the semiconductor device is a normally on, for example a depletion mode transistor device, the first dielectric constant may exceed the second dielectric constant.

If the semiconductor device is a normally off device, such as an enhancement mode transistor device, the first dielectric constant may be less than the second dielectric constant. However, the condition that the first dielectric constant exceeds the second dielectric constant might be suitable for some normally off semiconductor components.

Figure 6:
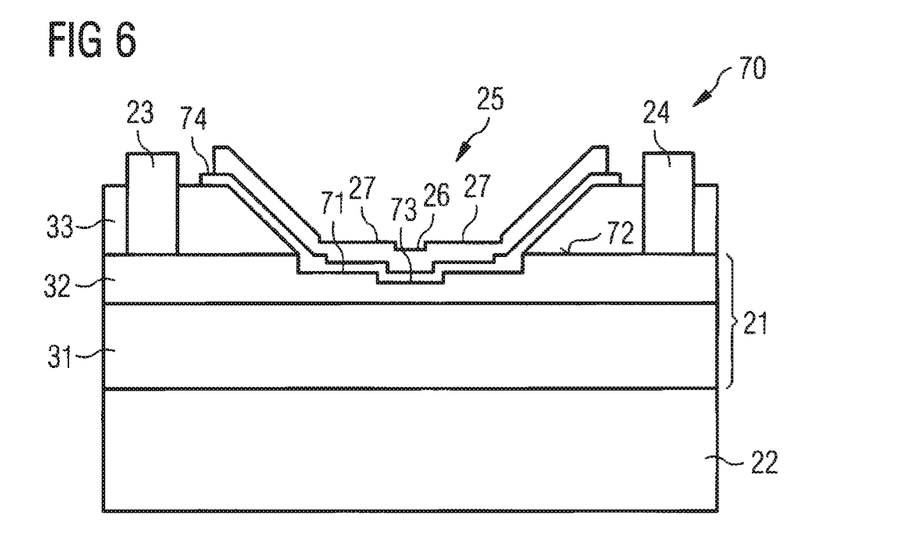
FIG. 6 illustrates a semiconductor device according to a sixth embodiment.

FIG. 6 illustrates a semiconductor device 70 according to a sixth embodiment.

According to the sixth embodiment, the semiconductor device 70 includes a substrate 22 and a GaN-based semiconductor layer 21 formed on the substrate 22. The GaN-based semiconductor layer 21 may include a GaN channel layer 31 and an AlGaN barrier layer 32, thereby forming a GaN-based HEMT.

The semiconductor device 70 may further include a passivation layer 33 arranged on the GaN-based semiconductor layer 21. There may be further a gate inter-layer dielectric 74, formed below the gate electrode 25.

According to the embodiment shown in FIG. 6, the AlGaN barrier layer 32 may have a first recess portion 71 formed in an upper surface 72 of the AlGaN electrode supply layer 32, the upper surface 72 of the AlGaN barrier layer 32 facing the passivation layer 33, and a second recess portion 73 formed within the first recess portion 71. The middle portion 26 of the gate electrode 25 may be provided in the second recess portion 73 and the second portions 27 of the gate electrode 25 may be provided in the first recess portion 71 outside of the second recess portion 73. This arrangement may be used to provide a potential distribution at the gate electrode 25 through a reduction of the thickness of the GaN-based semiconductor layer 21, in particular of the AlGaN barrier layer 32, below the second portions 27 and a further reduction of the thickness of the AlGaN barrier layer 32 below the middle portion 26. The semiconductor device 70 may be either a normally on semiconductor component or a normally off semiconductor component.

Figure 7:
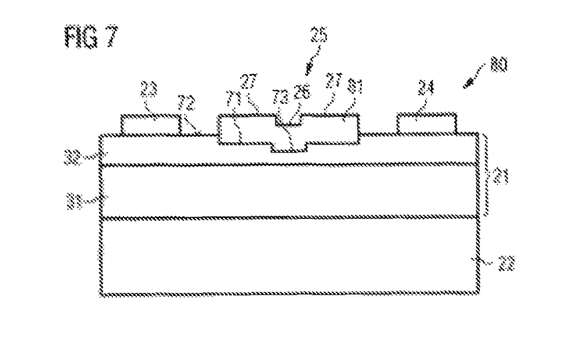
FIG. 7 illustrates a semiconductor device according to a seventh embodiment.

FIG. 7 illustrates a semiconductor device 80 according to a seventh embodiment. In the semiconductor device 80, the gate electrode may be a Schottky electrode 81. A Schottky contact may be formed by a metal/semiconductor contact so that a forward current can flow if a forward bias equal to a Schottky voltage or higher is applied.

The semiconductor device 80 includes a substrate 22 and a GaN-based semiconductor layer 21 formed on the substrate. The GaN-based semiconductor layer 21 may include a GaN channel layer 31 and an AlGaN barrier layer 32, thereby forming a GaN-based HEMT.

In the embodiment shown in FIG. 7, the AlGaN barrier layer 32 may have a first recess portion 71 formed in an upper surface 72 of the AlGaN electrode supply layer 32, the upper surface 72 of the AlGaN barrier layer 32 facing the passivation layer 33, and a second recess portion 73 formed within the first recess portion 71. The middle portion 26 of the gate electrode 25 and, therefore, of the Schottky electrode 81, may be provided in the second recess portion 73 and the second portions 27 of the gate electrode 25, the Schottky electrode 81, may be provided in the first recess portion 71. The metal of the gate electrode 25 is in direct contact with the AlGaN barrier layer 32 and is selected so as to form a Schottky contact with the AlGaN barrier layer 32. The shape of the gate electrode 25 may be used to provide a potential distribution at the gate electrode 25 through a reduction of the thickness of the GaN-based semiconductor layer 21, in particular of the AlGaN barrier layer 32, below the second portions 27 and a further reduction of the thickness of the AlGaN barrier layer 32 below the middle portion 26.

FIG. 8 illustrates a semiconductor device 90 according to an eighth embodiment. In the semiconductor device 90, the AlGaN barrier layer 32 may have a first recess portion 91 formed in a part of an upper surface 92 of the AlGaN barrier layer 32 and a second recess portion 93 may be formed within the first recess portion 91, The semiconductor device 90 may further include a p-type doped GaN layer 94 formed on the first recess portion 91 and the second recess portion 93. The middle portion 26 of the gate electrode 25 may be provided on an upper surface 95 of the p-type doped GaN layer 94 above the second recess portion 93 and the second portions 27 of the gate electrode 25 may be provided on the upper surface 95 of the p-type doped GaN layer 94 above portions of the first recess portion 91 outside of the second recess portion 93.

FIG. 8 illustrates a p-type GaN Gate-Injection Transistors, which may have inherently low on-state resistance and low switching losses and, therefore, remarkably reduces the energy consumption in power conversion systems. P-type GaN Gate-Injection Transistors may be used as normally off semiconductor transistor devices. The potential distribution at the gate electrode 25 may be achieved through a reduction of the thickness of the p-type doped GaN layer 94 and a coexistent increase of the thickness of the AlGaN barrier layer 32 below the second portions 27 of the gate electrode 25 and an increase of the thickness of the p-type doped GaN layer 94 coexistent with a reduction of the thickness of the AlGaN barrier layer 32 below the middle portion 26 of the gate electrode. This arrangement may be used to provide a control voltage which is less than the second voltage.

Figure 9:
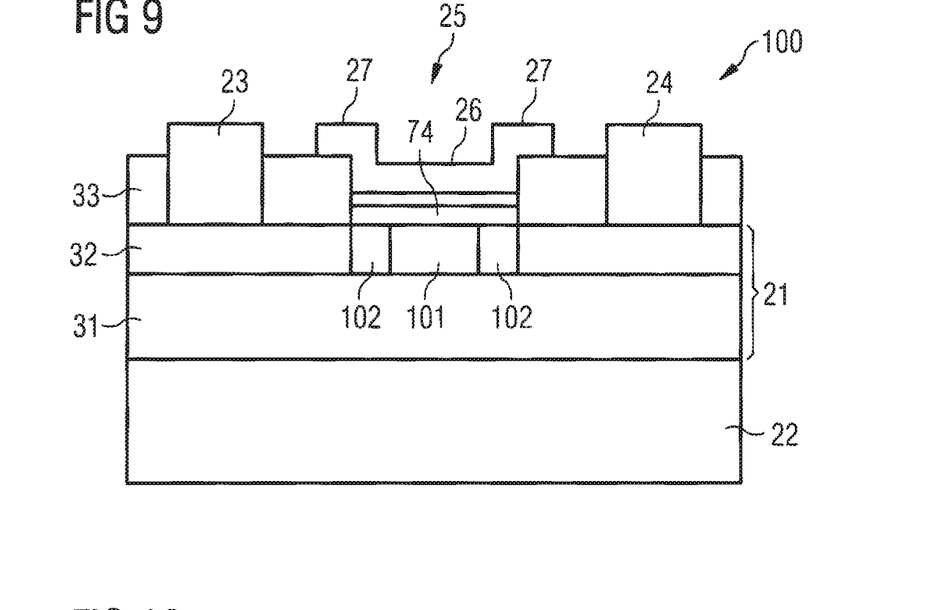
FIG. 9 illustrates a semiconductor device according to a ninth embodiment.

FIG. 9 illustrates a semiconductor device 100 according to a ninth embodiment. The semiconductor device 100 includes a substrate 22 A GaN channel layer 31 arranged on the substrate 22 and an AlGaN barrier layer 32, arranged on the GaN channel layer 31, thereby forming a GaN-based HEMT.

In the semiconductor device 100, the AlGaN barrier layer 32 may include a first portion 101, wherein negative fixed charges are incorporated into the first portion 101, and second portions 102 adjacent the first portion 101 of the AlGaN barrier layer 32, wherein positive fixed charges are incorporated into the second portions 102. The middle portion 26 of the gate electrode 25 may be provided on the first portion 101 of the AlGaN barrier layer 32 and the second portions 27 of the gate electrode 25 may be provided on the second portions 102 of the AlGaN barrier layer 32. A number of the charges incorporated into the first portion 101 may be less than a number of charges incorporated into the second portions 82.

Figure 10:
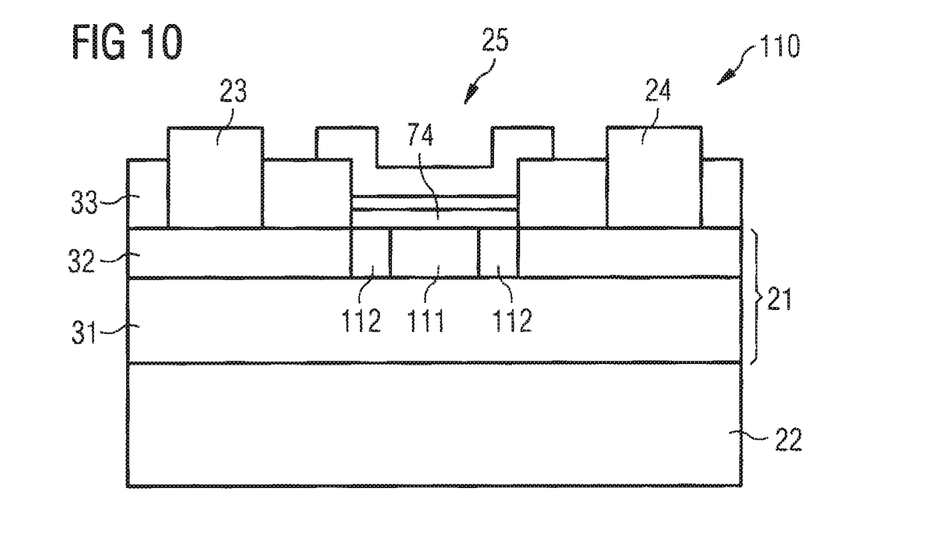
FIG. 10 illustrates a semiconductor device according to a tenth embodiment.

FIG. 10 illustrates a semiconductor device 110 according to a tenth embodiment. In the semiconductor device 110 the AlGaN barrier layer 32 may include a first portion 111, in which positive fixed charges are incorporated, and second portions 112 adjacent to the first portion 111, in which positive fixed charges are incorporated. A number of positive fixed charges incorporated into the first portion 111 may be less than a number of positive fixed charges incorporated into the second portions 112. The middle portion 26 of the gate electrode 25 may be provided on the first portion 111 and the second portions 27 of the gate electrode 25 may be provided on the second portions 112 of the AlGaN barrier layer 32.

Figure 11:
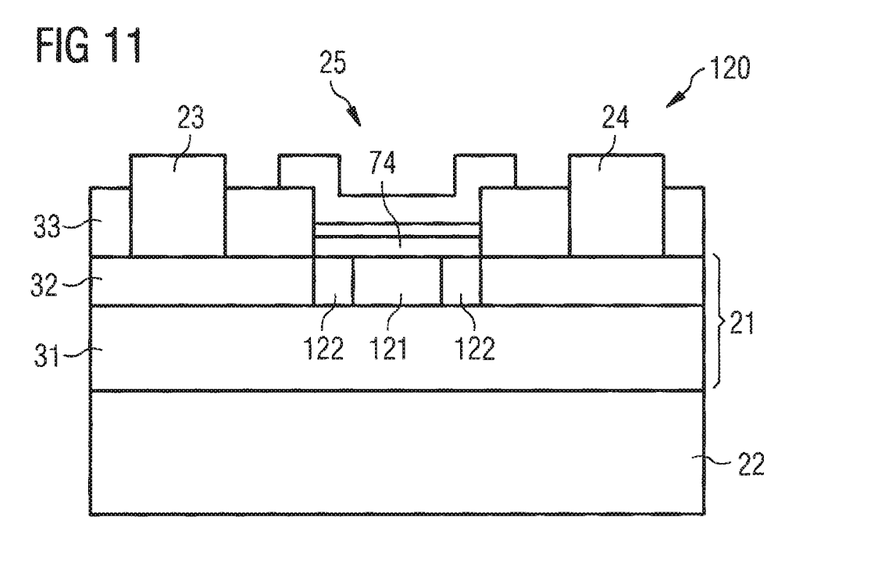
FIG. 11 illustrates a semiconductor device according to an eleventh embodiment.

FIG. 11 illustrates a semiconductor device 120 according to an eleventh embodiment. In the semiconductor device 120, the AlGaN barrier layer 32 may include a first portion 121, which includes no charges and second portions 122 adjacent the first portion 121, in which positive fixed charges are incorporated. The middle part 26 of the gate electrode 25 may be provided on the first portion 121 of the AlGaN barrier layer 32 and the second portions 27 of the gate electrode 25 may be provided on the second portions 122 of the AlGaN barrier layer 32.

That the charges are incorporated into the AlGaN barrier layer, as shown in FIGS. 9 to 11, should merely be understood as an example, however. The charges may be further incorporated into the gate inter-layer dielectric, forming the respective first and second portions in the gate inter-layer dielectric.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, the potential distribution can be achieved through ion implantation into an inter-layer dielectric OLD) formed below the gate electrode, too. This application is intended to cover any adaptations or variations of the specific embodiments discussed herein. Therefore, it is intended that this invention be limited only by the claims and the equivalents thereof.

What is claimed is:

1. A semiconductor device, comprising:
a group III-semiconductor-nitride-based channel layer;
a group III-semiconductor-nitride-based barrier layer formed on the channel layer;
a two-dimensional electron gas channel formed in the semiconductor device below the barrier layer;
a first current electrode and a second current electrode formed on the barrier layer and laterally spaced from each other; and
a gate structure formed on the barrier layer between the first current electrode and the second current electrode, the gate structure being configured to control a conduction state of the two-dimensional electron gas channel,
wherein the barrier layer comprises a symmetrically shaped recess between the first and second current electrodes, the symmetrically shaped recess comprising a first recess portion formed in a part of an upper surface of the barrier layer and a second recess portion formed within the first recess portion,
wherein the gate structure comprises a group III-semiconductor-nitride-based doped layer that fills the symmetrically shaped recess and an electrically conductive gate electrode formed on an upper side of the doped layer that is opposite from the barrier layer.

2. The semiconductor device of claim 1, wherein the gate structure is a continuous structure, and wherein the gate structure is the only structure disposed between the first and second current electrodes that is configured to control the conduction state of the two-dimensional electron gas channel.

3. The semiconductor device of claim 2, wherein a first thickness of the barrier layer directly underneath the second recess portion is less than a second thickness of the barrier layer underneath the first recess portion, and wherein the second thickness is less than a third thickness of the barrier layer outside of the symmetrically shaped recess.

4. The semiconductor device of claim 3, wherein the barrier layer has the third thickness continuously between the symmetrically shaped recess structure and the first electrode and between the symmetrically shaped recess structure and the second electrode.

5. The semiconductor device of claim 4, wherein the gate structure is laterally coextensive with the symmetrically shaped recess such that the symmetrically shaped recess is completely covered by the gate structure and such that all regions of the barrier layer having the third thickness are completely exposed from the gate structure.

6. The semiconductor device according to claim 1, wherein the channel layer comprises GaN, wherein the barrier layer comprises AlGaN, and wherein the doped layer comprises p-type doped GaN.

7. The semiconductor device according to claim 1, wherein the semiconductor device is an enhancement mode transistor device.

8. The semiconductor device of claim 1, wherein the group III-semiconductor-nitride-based doped layer completely fills the symmetrically shaped recess.

9. The semiconductor device of claim 8, wherein a complete bottom side of the gate electrode that interfaces with the upper side of the doped layer is planar.

10. The semiconductor device of claim 9, wherein the complete bottom side of the gate electrode is above an upper surface of the group III-semiconductor-nitride-based barrier layer, the upper surface of the group III-semiconductor-nitride-based barrier layer being opposite from the interface between the channel layer and the barrier layer.

* * * * *